United States Patent
Ohta et al.

(10) Patent No.: US 7,906,988 B2
(45) Date of Patent: Mar. 15, 2011

(54) TOLERANT BUFFER CIRCUIT AND INTERFACE

(75) Inventors: Kazuyo Ohta, Chiba (JP); Hideyuki Kihara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/621,776

(22) Filed: Nov. 19, 2009

(65) Prior Publication Data

US 2010/0134147 A1 Jun. 3, 2010

(30) Foreign Application Priority Data

Nov. 28, 2008 (JP) ................... 2008-305574

(51) Int. Cl.
*H03K 19/00* (2006.01)
*H03K 19/02* (2006.01)
(52) U.S. Cl. .................. 326/58; 326/59; 326/86; 326/87
(58) Field of Classification Search .............. 326/56–58, 326/63, 80–83, 86, 87, 95, 98; 327/333
See application file for complete search history.

(56) References Cited

U.S. PATENT DOCUMENTS

| 6,046,626 | A | * | 4/2000 | Saeki et al. | ................... | 327/536 |
| 6,118,301 | A | * | 9/2000 | Singh et al. | ................... | 326/58 |
| 6,304,112 | B1 | | 10/2001 | Annema et al. | | |
| 7,375,555 | B1 | | 5/2008 | Wang et al. | | |
| 7,453,310 | B2 | | 11/2008 | Ota et al. | | |
| 2008/0116751 | A1 | * | 5/2008 | Kihara et al. | ................... | 307/113 |

FOREIGN PATENT DOCUMENTS

| JP | 5-284001 | 10/1993 |
| JP | 2008-131305 | 6/2008 |

OTHER PUBLICATIONS

English language Abstract of JP 5-284001, Oct. 29, 1993.
English language Abstract of JP 2008-131305, Jun. 5, 2008.

* cited by examiner

*Primary Examiner* — Rexford N Barnie
*Assistant Examiner* — Jany Tran
(74) *Attorney, Agent, or Firm* — Greenblum & Bernstein P.L.C.

(57) ABSTRACT

The tolerant buffer circuit and interface are provided in which reverse inflow of current to a power supply voltage from an output terminal does not occur, even if the output terminal is at a higher potential than an output circuit power supply voltage during open-drain operation in an output circuit of a semiconductor integrated circuit, or if the output circuit power supply voltage becomes 0 V. A tolerant buffer circuit is provided with first and second PMOS transistors that are connected in series and that share a source between a power supply terminal and an output terminal, an NMOS transistor connected between the output terminal and a ground terminal, a first inverter output-connected to the gate of the first PMOS transistor, a second inverter output-connected to the gate of the second PMOS transistor, and a control circuit that outputs first, second, and third control signals to the first PMOS transistor, the second PMOS transistor, and the NMOS transistor, respectively, and controls the on/off state of these MOS transistors.

6 Claims, 5 Drawing Sheets

| INPUT TERMINALS | | | CONTROL TERMINALS | | | OUTPUT TERMINALS | |
|---|---|---|---|---|---|---|---|
| A | B | IN | 132 | 133 | 134 | 102 | |
| 1 | 0 | X | 0 | 0 | 0 | Hiz | |
| 0 | 0 | X | 0 | 0 | 1 | Low | |
| 1 | 1 | 0 | 1 | 0 | 1 | Low | PUSH-PULL OPERATION |
| 1 | 1 | 1 | 1 | 1 | 0 | High | |
| 0 | 1 | 0 | 0 | 0 | 1 | Low | OPEN-DRAIN OPERATION |
| 0 | 1 | 1 | 0 | 0 | 0 | Hiz | |

| INPUT TERMINALS | | | CONTROL TERMINALS | | | OUTPUT TERMINALS | |
|---|---|---|---|---|---|---|---|
| A | B | IN | 132 | 133 | 134 | 102 | |
| 1 | 0 | X | 0 | 0 | 0 | Hiz | |
| 0 | 0 | X | 0 | 0 | 1 | Low | |
| 1 | 1 | 0 | 1 | 0 | 1 | Low | PUSH-PULL OPERATION |
| 1 | 1 | 1 | 1 | 1 | 0 | High | |
| 0 | 1 | 0 | 0 | 0 | 1 | Low | OPEN-DRAIN OPERATION |
| 0 | 1 | 1 | 0 | 0 | 0 | Hiz | |

US 7,906,988 B2

TOLERANT BUFFER CIRCUIT AND INTERFACE

CROSS REFERENCE TO RELATED APPLICATIONS

The disclosure of Japanese Patent Application No.2008-305574 filed on Nov. 28, 2008 including the specification, drawings and abstract is incorporated herein by reference in its entirety.

TECHNICAL FIELD

The present invention relates to a tolerant buffer circuit and interface used in an output circuit of a semiconductor integrated circuit or the like, and more particularly to a tolerant buffer circuit connected to a signal interface part having a plurality of power supplies whose output terminal potentials differ.

BACKGROUND ART

In recent years, with the increasing speed of CPUs and so forth, semiconductor integrated circuit apparatuses that use low-voltage drive have been developed, and it has become common for terminals of a plurality of power supplies whose signal levels differ to be connected to the same bus, and for multi-potential interface signals to be generated. In this case, an output circuit is used that has a tolerant configuration in which a current does not flow in reverse in a power supply voltage from an output terminal.

In Patent Document 1 (Unexamined Japanese Patent Publication No. HEI 5-284001), an output circuit is disclosed that, when a power supply of one integrated circuit among a plurality of integrated circuits is turned off, prevents reverse inflow from an output terminal to another integrated circuit.

FIG. 1 is a circuit diagram of an output circuit described in Patent Document 1.

As shown in FIG. 1, output circuit 10 is configured by means of an output buffer comprising P-channel MOS (Metal Oxide Semiconductor) transistor Q21 whose source is connected to low-voltage power supply VDD14 and N-channel MOS transistor Q22 whose source is connected to ground terminal 3, and N-channel MOS transistor Q23 whose source and drain are connected between a connecting point of MOS transistors Q21 and Q22 and output terminal 13, and whose gate is connected to high-voltage power supply 15. Also, output circuit 10 is provided with an input protection circuit that uses input terminals 11 and 12, output terminal 13, logic elements 24, 25, and 26, and parasitic diodes D21 and D22.

The gates of P-channel MOS transistor Q21 and N-channel MOS transistor Q22 of output circuit 10 are configured so as to control signals input from input terminals 11 and 12 via logic elements 24, 25, and 26. In the above configuration, low-voltage power supply VDD14 is supplied from high-voltage power supply via a regulator, and is turned on/off in conjunction with high-voltage power supply 15.

In the above configuration, in normal operation, low-voltage power supply VDD14 and high-voltage power supply 15 are applied to output circuit 10, and N-channel MOS transistor Q23 is in an on state. Operation is performed whereby a control signal is output to output terminal 13 by means of control of signals from input terminals 11 and 12. On the other hand, when high-voltage power supply 15 is in an off state, low-voltage power supply VDD14 becomes 0 V, but since N-channel MOS transistor Q23 is turned off, reverse inflow of current from output terminal 13 is prevented.

In Patent Document 2 (Unexamined Japanese Patent Publication No. 2008-131305), a semiconductor switch circuit is disclosed that enables current consumption to be reduced in a conducted state.

FIG. 2 is a circuit diagram of a semiconductor switch circuit described in Patent Document 2.

As shown in FIG. 2, semiconductor switch circuit 30 has a configuration provided with P-channel MOS transistors Q41 and Q42 for conduction that are connected in series and that share a source between input/output terminal 31 and input/output terminal 32, P-channel MOS transistor Q43 and N-channel MOS transistor Q45 whose drains are connected to the gate of Q41, P-channel MOS transistor Q44 and N-channel MOS transistor Q46 whose drains are connected to the gate of Q42, and control terminal 33 connected to the gate of each transistor, in which the sources and back-gates of Q43 and Q44 are connected to the sources of Q41 and Q42, and switching between conducted/non-conducted between input/output terminal 31 and input/output terminal 32 is performed by voltage control by means of voltage value Vcont of a control signal applied to control terminal 33.

In the above configuration, semiconductor switch circuit 30 switches P-channel MOS transistors Q41 and Q42 between conducted/non-conducted by control terminal 33 control of the voltage applied to input/output terminal 31 or input/output terminal 32. By this means it is possible for semiconductor switch circuit 30 to operate as a semiconductor switch circuit. Thus, even if a control signal is not applied to control terminal 33, reverse inflow is prevented between input/output terminals 31 and 32, and a non-conducted state is implemented dependably.

However, the following kinds of problems are associated with such conventional semiconductor integrated circuits.

With the output circuit described in Patent Document 1, since output circuit low-voltage power supply VDD14, and high-voltage power supply 15 having higher potential than low-voltage power supply VDD14 for performing on/off control of N-channel MOS transistor Q23, are necessary, a dual-power-supply configuration with two different potentials is necessary.

Also, with combinations of input terminal 11 high and input terminal 12 low, and input terminal 11 low and input terminal high, P-channel MOS transistor Q21 and N-channel MOS transistor Q22 are turned off at the same time. When N-channel MOS transistor Q23 is on, there is a potential resulting from adding together the potentials of P-channel MOS transistor Q21 parasitic diode D21 and VDD14 at output terminal 13, and when this potential or higher is attained, reverse inflow of current to low-voltage power supply VDD14 occurs via parasitic diode D21.

Thus, high-voltage power supply 15 that controls N-channel MOS transistor Q23 is defined as the high potential of the output circuit. However, when output terminal 13 is at a high level when the impedance of an element connected to output terminal 13 is low, the potential between the gate and source of N-channel MOS transistor Q23 becomes large, the potential that should be supplied falls below the potential of low-voltage power supply VDD14, and an adequate dynamic range may not be able to be secured.

The semiconductor switch circuit described in Patent Document 2 is an excellent semiconductor switch circuit that enables a non-conducted state to be maintained dependably between switch terminals even if a control signal has ceased to be applied to a control terminal, and that can be implemented with an extremely simple circuit configuration. However, semiconductor switch circuit 30 described in Patent Document 2 is a circuit for which operation as a semiconductor switch circuit is assumed, and is not optimized as an output circuit. That is to say, in the case of semiconductor switch circuit 30, operation as a semiconductor switch circuit is assumed whereby P-channel MOS transistors Q41 and Q42 simultaneously go to the off state or simultaneously go to the on state since gates of P-channel MOS transistors Q43 and Q44 and N-channel MOS transistors Q45 and Q46 are common. Open-drain operation or push-pull operation necessary for an output circuit is not envisaged for semiconductor switch circuit 30.

SUMMARY OF INVENTION

It is an object of the present invention to provide a tolerant buffer circuit and interface in which reverse inflow of current to a power supply voltage from an output terminal does not occur even if an output terminal is at a higher potential than an output circuit power supply voltage during open-drain operation in an output circuit of a semiconductor integrated circuit, or if an output circuit power supply voltage becomes 0 V.

Solution To Problem

According to an aspect of the invention, a tolerant buffer circuit is provided with: first and second P-channel MOS transistors that are connected in series and that share a source between a power supply terminal and output terminal; a first N-channel MOS transistor connected between the output terminal and a ground terminal; and a control circuit that outputs first, second, and third control signals respectively to the first P-channel MOS transistor, the second P-channel MOS transistor, and the first N-channel MOS transistor, and controls an on/off state of these MOS transistors.

According to another aspect of the invention, an interface outputs CPU and register output signals to an external device via a tolerant buffer circuit, wherein the tolerant buffer circuit is the tolerant buffer circuit.

DESCRIPTION OF EMBODIMENTS

With reference now to the accompanying drawings, embodiments of the present invention will be described in detail below.

Embodiment 1

Figure 3:
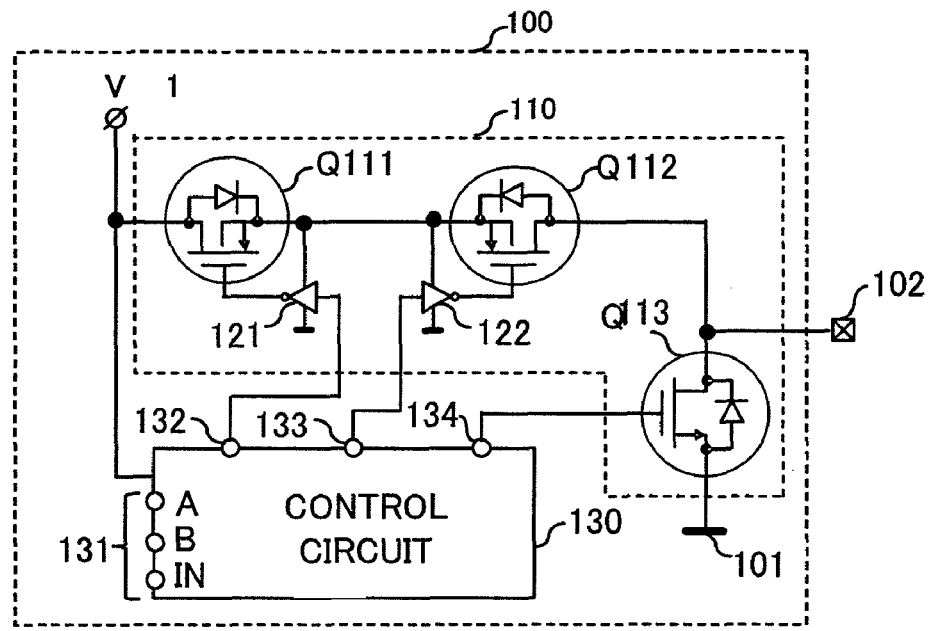
FIG. 3 is a circuit diagram showing a configuration of a tolerant buffer circuit according to Embodiment 1 of the present invention.

FIG. 3 is a circuit diagram showing a configuration of a tolerant buffer circuit according to Embodiment 1 of the present invention. This embodiment is an example of application to a tolerant buffer circuit incorporated in an output interface.

As shown in FIG. 3, tolerant buffer circuit 100 is configured by means of output circuit 110, control circuit 130 that controls output circuit 110, power supply terminal VDD1, ground terminal 101, and output terminal 102.

Output circuit 110 is configured by means of P-channel MOS transistors Q111 and Q112 that are connected in series and that share a source between power supply terminal VDD1 and output terminal 102, N-channel MOS transistor Q113 connected between output terminal 102 and ground terminal 101, inverter 121 output-connected to the gate of P-channel MOS transistor Q111, and inverter 122 output-connected to the gate of P-channel MOS transistor Q112.

Control circuit 130 is provided with input terminals 131 comprising input terminals A, B, and IN, and control terminals 132, 133, and 134 that output first through third control signals, and outputs first and second control signals to the input terminals of inverters 121 and 122, and the third control signal to the gate of N-channel MOS transistor Q113.

Control circuit 130 outputs first, second, and third control signals to P-channel MOS transistor Q111, P-channel MOS transistor Q112, and N-channel MOS transistor Q113 respectively, and controls the on/off state of these MOS transistors.

Specifically, control circuit 130 outputs first and second control signals to P-channel MOS transistors Q111 and Q112 via inverters 121 and 122 and performs on/off control of P-channel MOS transistors Q111 and Q112, and also outputs a third control signal to the gate of N-channel MOS transistor Q113 and performs on/off control of N-channel MOS transistor Q113. Control circuit 130 operates with power supply terminal VDD1 as a power supply.

The gates of P-channel MOS transistors Q111 and Q112 are connected to ground potential or source potential based on first and second control signals from control terminals 132 and 133.

The gate of N-channel MOS transistor Q113 is connected to ground potential or power supply potential based on a third control signal from control terminal 134.

Inverter 121 has the source potential of P-channel MOS transistor Q111 as a high-potential-side power supply, has control signal 132 as input, and has its output connected to the gate of P-channel MOS transistor Q111.

Inverter 122 has the source potential of P-channel MOS transistor Q112 as a high-potential-side power supply, has control signal 133 as input, and has its output connected to the gate of P-channel MOS transistor Q112.

Thus, in tolerant buffer circuit 100, power supply terminal VDD1 is connected to the drain of P-channel MOS transistor Q111, P-channel MOS transistors Q111 and Q112 are connected to a back-gate and source in common, the drain of P-channel MOS transistor Q112 is connected to output terminal 102, and N-channel MOS transistor Q113 is connected between output terminal 102 and ground terminal 101. Also, the power supplies of inverters 121 and 122 are supplied from the sources of P-channel MOS transistors Q111 and Q112. Since P-channel MOS transistors Q111 and Q112 have sources in common and their back-gates are also connected to the sources, P-channel MOS transistor Q111 and P-channel MOS transistor Q112 parasitic diodes are connected in series in opposite directions.

Figure 4:
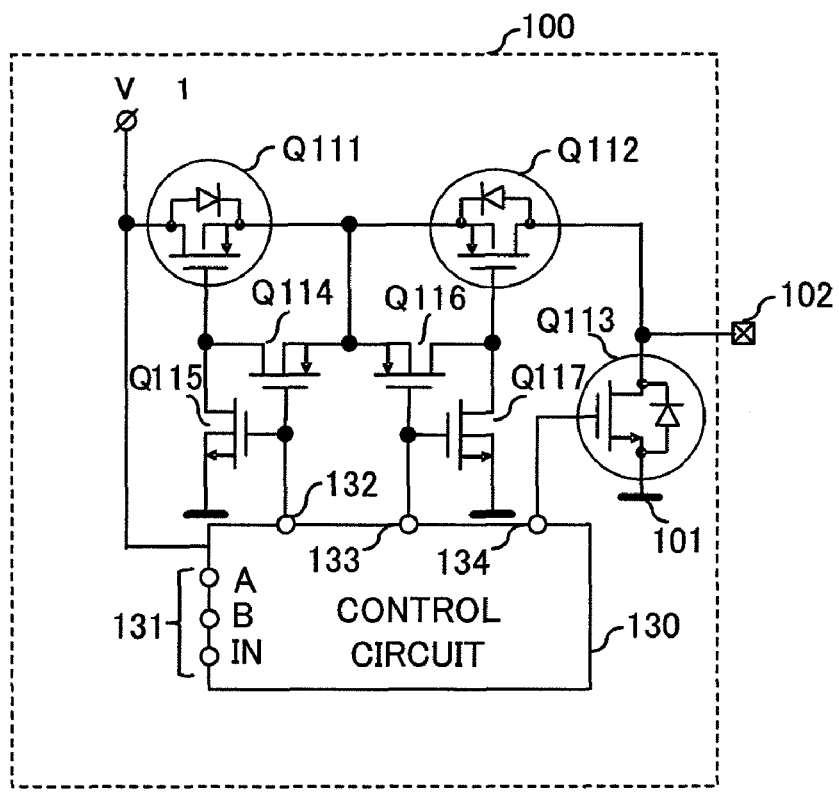
FIG. 4 is a detailed circuit diagram showing a configuration of a tolerant buffer circuit according to above Embodiment 1.

FIG. 4 is a detailed circuit diagram of tolerant buffer circuit 100 shown in FIG. 3. Configuration parts identical to those in FIG. 3 are assigned the same reference codes as in FIG. 3.

As shown in FIG. 4, inverter 121 (FIG. 3) is configured by means of P-channel MOS transistor Q114 and N-channel MOS transistor Q115, and inverter 122 (FIG. 3) is configured by means of P-channel MOS transistor Q116 and N-channel MOS transistor Q117.

The gate of P-channel MOS transistor Q111 is connected to the drains of P-channel MOS transistor Q114 and N-channel MOS transistor Q115. The gate of P-channel MOS transistor Q112 is connected to the drains of P-channel MOS transistor Q116 and N-channel MOS transistor Q117.

Control terminal 132 of control circuit 130 is connected to the gates of P-channel MOS transistor Q114 and N-channel MOS transistor Q115. Control terminal 133 is connected to the gates of P-channel MOS transistor Q116 and N-channel MOS transistor Q117.

Figures 5, 6:
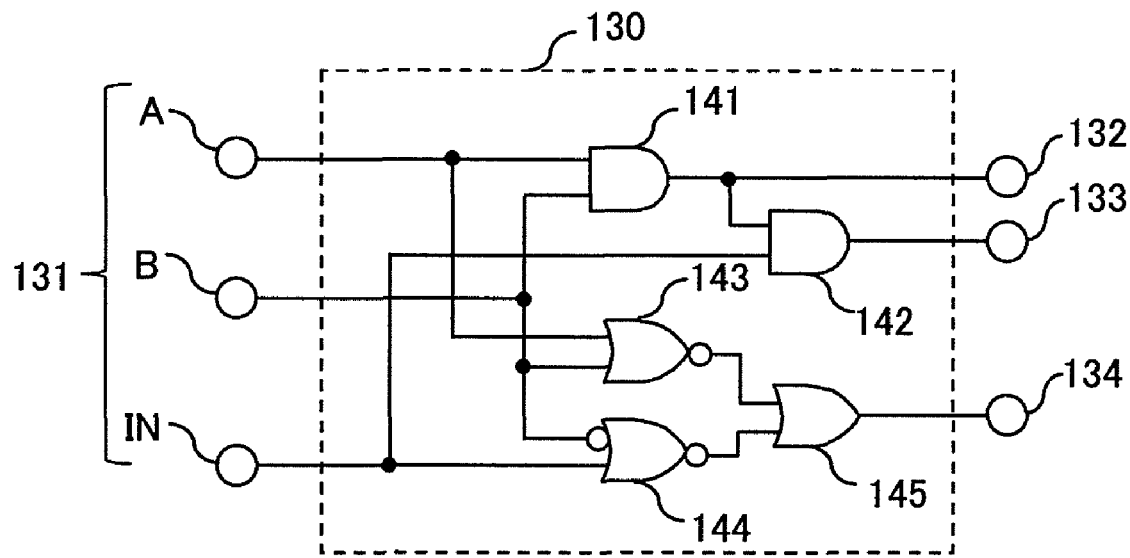
FIG. 5 is a circuit diagram showing an example of an actual configuration of a control circuit of a tolerant buffer circuit according to above Embodiment 1.
FIG. 6 is a diagram showing states of input terminals, control terminals, and an output terminal of a control circuit of a different tolerant buffer circuit according to Embodiment 1 in a truth table.

FIG. 5 is a circuit diagram showing an example of an actual configuration of above-described control circuit 130.

As shown in FIG. 5, control circuit 130 is configured by means of input terminals A, B, and IN, control terminals 132, 133, and 134, and logic elements 141, 142, 143, 144, and 145. Control circuit 130 is applied to a UART (Universal Asynchronous Receiver Transmitter) interface described later herein.

Input terminals A, B, and IN correspond to input terminals 131 in FIG. 3, and control terminals 132, 133, and 134 are output terminals.

Logic element 141 is configured by means of a 2-input AND with input terminals A and B as inputs, and output connected to control terminal 132.

Logic element 142 is configured by means of a 2-input AND with logic element 141 output and input terminal IN as inputs, and output connected to control terminal 133, and logic element 143 is configured by means of a 2-input NOR with input terminal A and input terminal B as inputs.

Logic element 144 is configured by means of a 2-input NOR with an input terminal B inverted signal and input terminal IN as inputs.

Logic element 145 is configured by means of a 2-input OR with logic element 143 and 144 outputs connected to the inputs, and output connected to control terminal 134.

The operation of above-described control circuit 130 will be described later herein using the truth table in FIG. 6.

The operation of tolerant buffer circuit 100 configured as described above will now be described using FIG. 4. As FIG. 4 is equivalent to FIG. 3, it will be described in contrast to the configuration in FIG. 3 as appropriate.

In FIG. 4, when a voltage is applied to power supply terminal VDD1 and a potential is not applied to output terminal 102, since the sources of P-channel MOS transistors Q111 and Q112 are connected in common, the source potentials of P-channel MOS transistors Q111 and Q112 are both a value decreased by the voltage of the Q111 parasitic diode from the power supply terminal VDD1 potential.

In this state, when control terminal 132 is driven high, P-channel MOS transistor Q114 is turned off and N-channel MOS transistor Q115 is turned on. That is to say, in FIG. 3, inverter 121 outputs a low signal, and therefore the gate of P-channel MOS transistor Q111 is grounded and P-channel MOS transistor Q111 is turned on.

When P-channel MOS transistor Q111 is turned on, the source potential of P-channel MOS transistors Q111 and Q112 becomes potential of the power supply terminal VDD1.

When control terminal 132 is kept high, control terminal 133 is driven low, and control terminal 134 is driven high, P-channel MOS transistor Q116 is turned on and N-channel MOS transistor Q117 is turned off. That is to say, in FIG. 3, inverter 122 outputs a high signal, and therefore the potential of the gate of P-channel MOS transistor Q112 becomes VDD1 and Q112 is turned off, the gate of N-channel MOS transistor Q113 is high and Q113 is therefore turned on, and ground potential is output from output terminal 102.

When control terminal 133 is driven high and control terminal 134 is driven low, P-channel MOS transistor Q116 is turned off and N-channel MOS transistor Q117 is turned on. That is to say, in FIG. 3, inverter 122 outputs a low signal, and therefore the potential of the gate of P-channel MOS transistor Q112 becomes ground potential and Q112 is turned on, the gate of N-channel MOS transistor Q113 is low and Q113 is therefore turned off, and VDD1 is output from output terminal 102.

As described above, driving control terminals 133 and 134 low/high or high/low results in push-pull operation in which VDD1 and ground potential are output to output terminal 102.

When control terminal 132 is driven low, control terminal 133 is driven low, and control terminal 134 is driven high, P-channel MOS transistors Q114 and Q116 are turned on, and N-channel MOS transistors Q115 and Q117 are turned off. That is to say, in FIG. 3, inverter 121 and inverter 122 both output a high signal, and therefore the potential of the gates of P-channel MOS transistors Q111 and Q112 becomes the source potential to which P-channel MOS transistors Q111 and Q112 are connected in common—that is, a value decreased by the voltage of the Q111 parasitic diode from the power supply terminal VDD1 potential—and Q111 and Q112 are therefore turned off, the gate of N-channel MOS transistor Q113 is high and Q113 is therefore turned on, and ground potential is output from output terminal 102.

Similarly, when control terminal 132 is driven high, control terminal 133 is driven high, and control terminal 134 is driven low, P-channel MOS transistors Q114 and Q116 are turned off, and N-channel MOS transistors Q115 and Q117 are turned on. That is to say, in FIG. 3, inverter 121 and inverter 122 both output a low signal, and therefore the potential of the gates of P-channel MOS transistors Q111 and Q112 becomes ground potential and Q111 and Q112 are turned on, the gate of N-channel MOS transistor Q113 is low and Q113 is therefore turned off, and VDD1 is output from output terminal 102.

As described above, synchronizing control terminals 132 and 133, and driving control terminals 132, 133, and 134 low/low/high or high/high/low results in push-pull operation in which VDD1 and ground potential are output to output terminal 102.

At the time of this push-pull operation, P-channel MOS transistor Q111 maintains an on state, and when P-channel MOS transistor Q112 is on, output terminal 102 can output VDD1 potential, and since an N-channel MOS transistor is not used on the output-stage VDD1 side as viewed from output terminal 102, a dynamic range can be adequately secured.

Then, when control terminals 132 and 133 are driven low, P-channel MOS transistors Q114 and Q116 are turned on, and N-channel MOS transistors Q115 and Q117 are turned off. That is to say, in FIG. 3, inverter 121 and inverter 122 both output a high signal, and therefore the potential of the gates of P-channel MOS transistors Q111 and Q112 become the source potential to which P-channel MOS transistors Q111 and Q112 are connected in common—that is, a value decreased by the voltage of the Q111 parasitic diode from the power supply terminal VDD1 potential—and Q111 and Q112 are therefore turned off. When high/low control of control terminal 134 is performed in this state, Q113 operates as on/off, and open-drain operation is implemented for output terminal 102.

At the time of this open-drain operation, if a potential higher than VDD1 is applied to output terminal 102—such as when an output terminal of another power supply circuit of higher potential than VDD1 is connected to output terminal 102, for example—even though the output terminal 102 potential becomes higher than VDD1, reverse inflow of current to power supply terminal VDD1 does not occur since the configuration has a P-channel MOS transistor Q111 parasitic diode connected in series in the opposite direction to VDD1, and it is possible to prevent a reverse current from output terminal 102.

Then, when control terminals 132, 133, and 134 are driven low, P-channel MOS transistors Q114 and Q116 are turned on, and N-channel MOS transistors Q115 and Q117 are turned off. That is to say, in FIG. 3, inverter 121 and inverter 122 both output a high signal, and therefore the potential of the gates of P-channel MOS transistors Q111 and Q112 becomes the source potential to which P-channel MOS transistors Q111 and Q112 are connected in common—that is, a value decreased by the voltage of the Q111 parasitic diode from the power supply terminal VDD1 potential—and Q111 and Q112 are therefore turned off, the gate of N-channel MOS transistor Q113 is low and Q113 is therefore turned off, and output terminal 102 goes to a high-impedance state. In this state, also, even if a potential higher than VDD1 is applied to output terminal 102 as described above, reverse inflow of current to power supply terminal VDD1 does not occur since the configuration has a P-channel MOS transistor Q111 parasitic diode connected in series in the opposite direction to VDD1, and it is possible to prevent a reverse current from output terminal 102.

Furthermore, when power supply terminal VDD1 becomes 0 V, the power supply voltage of control circuit 130 also becomes 0 V, and therefore the source potential of P-channel MOS transistors Q114 and Q116 controlling P-channel MOS transistors Q111 and Q112 configuring an output stage also becomes 0 V, and the P-channel MOS transistor Q114 and Q116 and N-channel MOS transistor Q115 and Q117 circuits are also turned off dependably. That is to say, in FIG. 3, inverter 121 and inverter 122 do not operate. Therefore, even though output terminal 102 potential is generated when a potential higher than VDD1 is applied to output terminal 102, reverse inflow of current to power supply terminal VDD1 does not occur since the configuration has a P-channel MOS transistor Q111 parasitic diode connected in series in the opposite direction to VDD1, and it is possible to prevent a reverse current from output terminal 102.

With tolerant buffer circuit 100, since P-channel MOS transistors Q111 and Q112 are connected in series in opposite directions between power supply terminal VDD1 and output terminal 102, a reverse inflow current can be prevented from flowing to VDD1 from output terminal 102 by means of the P-channel MOS transistor Q111 and Q112 parasitic diodes.

The operation of control circuit 130 will now be described using the truth table in FIG. 6.

FIG. 6 is a drawing showing states of control circuit 130 input terminals A, B, and IN, control terminals 132, 133, and 134, and output terminal 102 in a truth table.

When input terminal A is high and input terminal B is low, control terminals 132, 133, and 134 output a low signal and output terminal 102 goes to a high-impedance state, irrespective of the state of input terminal IN.

When input terminal A is low and input terminal B is low, control terminals 132 and 133 output a low signal, control terminal 134 outputs a high signal, and output terminal 102 goes low, irrespective of the state of input terminal IN.

When input terminals A and B are high, control terminal 132 goes high, and therefore by driving input terminal IN low/high, control terminal 133 goes low/high, control terminal 134 goes high/low, and output terminal 102 performs push-pull operation.

When input terminal A is low and input terminal B is high, control terminals 132 and 133 go low, and therefore by driving input terminal IN low/high, control terminal 134 goes high/low, and output terminal 102 performs open-drain operation.

Furthermore, when power supply terminal VDD1 becomes 0 V, the power supply of control circuit 130 also becomes 0 V since it is VDD1, control terminals 132, 133, and 134 that are control circuit 130 outputs are also forcibly turned off, and a tolerant configuration of the output-stage is secured. Therefore, even though output terminal 102 potential is generated when a potential higher than VDD1 is applied to output terminal 102, reverse inflow of current to power supply terminal VDD1 does not occur since the configuration ensures that control circuit 130 output is turned off dependably and has a P-channel MOS transistor Q111 parasitic diode connected in series in the opposite direction to VDD1, and it is possible to prevent a reverse current from output terminal 102.

As described above, according to this embodiment tolerant buffer circuit 100 is provided with P-channel MOS transistors Q111 and Q112 that are connected in series and that share a source between power supply terminal VDD1 and output terminal 102, N-channel MOS transistor Q113 connected between output terminal 102 and ground terminal 101, inverter 121 output-connected to the gate of P-channel MOS transistor Q111, inverter 122 output-connected to the gate of P-channel MOS transistor Q112, and control circuit 130 that outputs first, second, and third control signals to P-channel MOS transistor Q111, P-channel MOS transistor Q112, and N-channel MOS transistor Q113 respectively, and controls the on/off state of these MOS transistors. For example, by driving control terminals 132, 133, and 134 low/low/high or high/high/low, control circuit 130 implements push-pull operation in which VDD1 and ground potential are output to output terminal 102. And by driving control terminals 132 and 133 low and driving control terminal 134 high/low, control circuit 130 implements open-drain operation for output terminal 102.

Thus, with tolerant buffer circuit 100, a reverse inflow current can be prevented from flowing to VDD1 from output terminal 102 even if output terminal 102 potential becomes higher than the output circuit 110 power supply voltage during open-drain operation of output circuit 110, or if VDD1 of output circuit 110 becomes 0 V.

Figure 1:
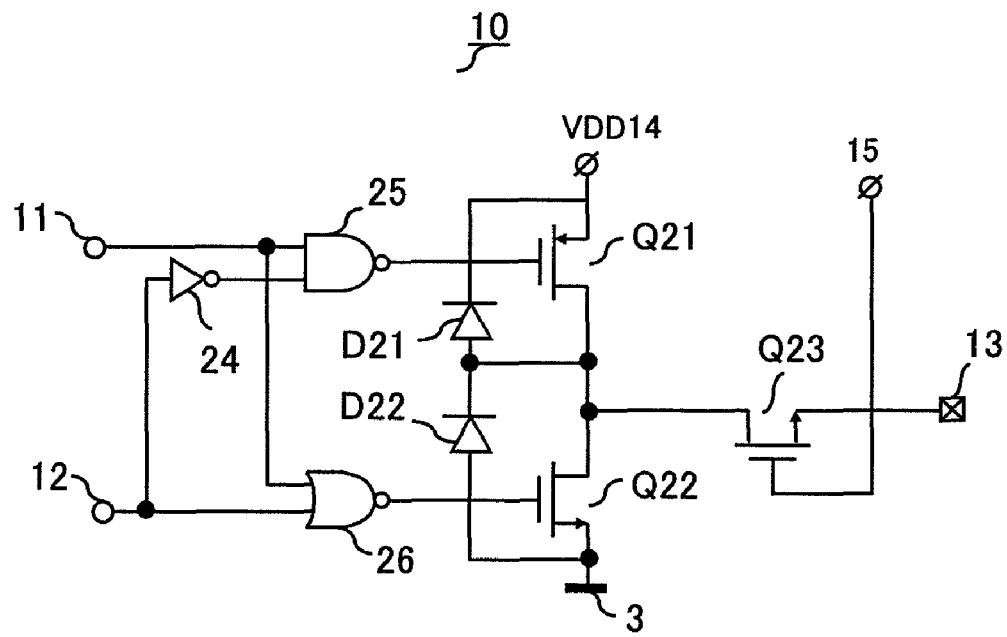
FIG. 1 is a circuit diagram of a conventional output circuit.
Figure 2:
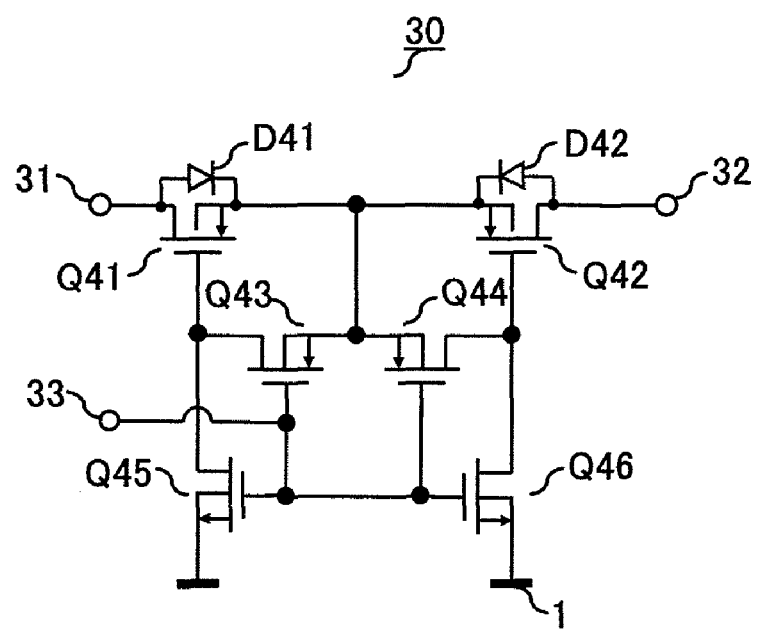
FIG. 2 is a circuit diagram of a conventional semiconductor switch circuit.

That is to say, with a conventional output circuit, preventing a reverse inflow current from an output terminal requires a dual-power-supply configuration with two different potentials such as low-voltage power supply VDD14 and high-voltage power supply 15 shown in FIG. 1. By contrast, with this embodiment an output circuit with a single power supply configuration comprising only power supply terminal VDD1 can be implemented. Also, with the conventional output circuit in FIG. 1, reverse inflow of a current occurs via a parasitic diode if the output terminal potential rises to a certain level or above. With this embodiment, this can be prevented.

Also, with this embodiment, a dynamic range can be adequately secured since an N-channel MOS transistor such as N-channel MOS transistor Q23 in FIG. 1 is not used on the output-stage power supply side as viewed from the output terminal.

Furthermore, with this embodiment push-pull operation is also possible, and individual control is also possible for output-stage transistors.

Moreover, this embodiment can be realized by means of an extremely simple circuit configuration, enabling easy implementation with a small number of component parts.

In this embodiment, inverters 121 and 122 shown in FIG. 3 have been described using configurations such as illustrated by MOS transistors Q114 through Q117 in FIG. 4, but this embodiment is not limited to these CMOS configurations. All that is needed is a configuration that functions as an inverter for control terminals 132 and 133, and the same kind of operation is possible without imposing restrictions on the number of CMOS gate stages or their type, such as NAND or NOR configurations.

Embodiment 2

Embodiment 2 is an example of application of tolerant buffer circuit 100 to a UART interface.

Figure 7:
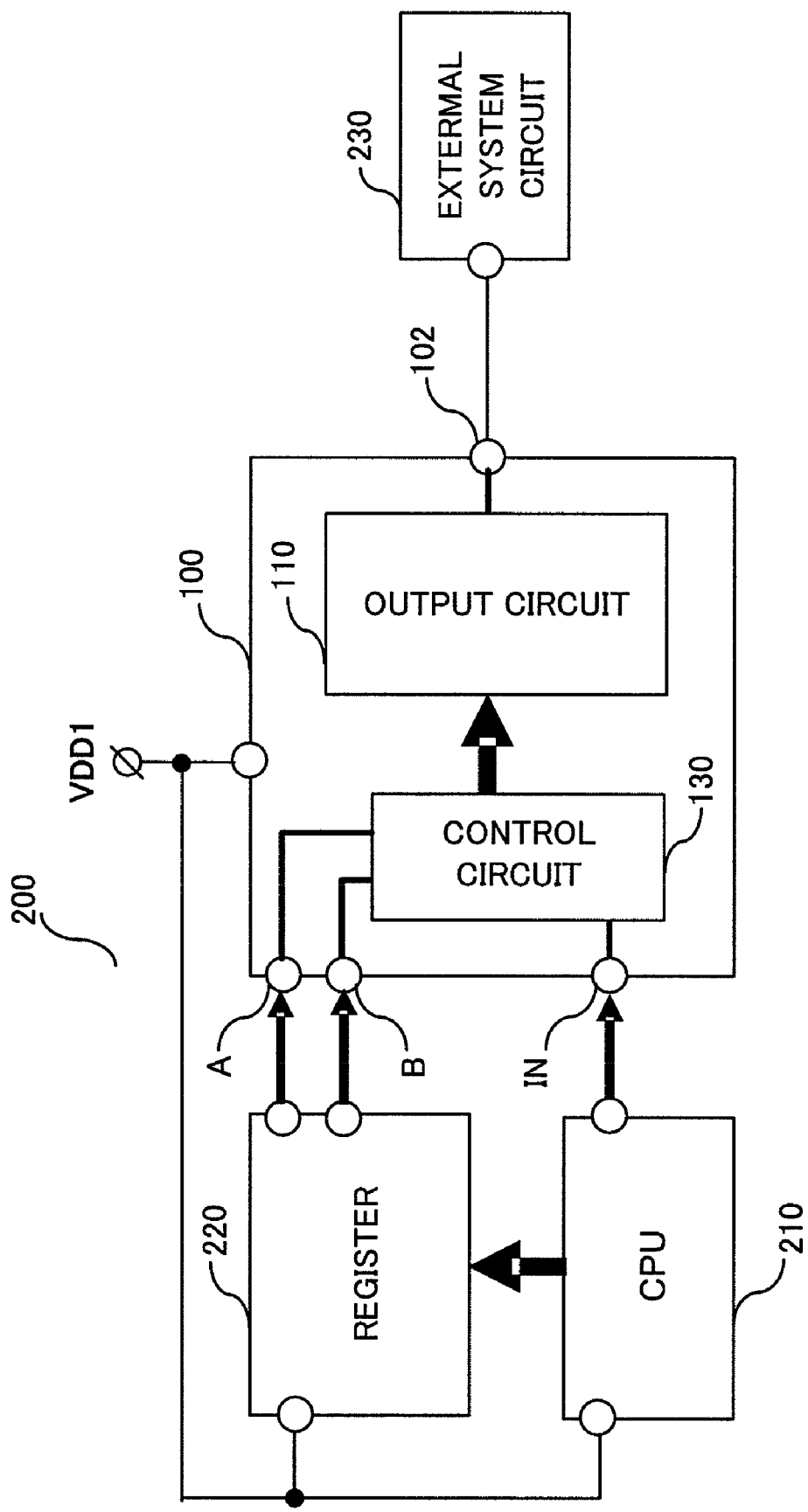
FIG. 7 is a block diagram of a UART interface having a tolerant buffer circuit according to Embodiment 2 of the present invention.

FIG. 7 is a block diagram of a UART interface having a tolerant buffer circuit according to Embodiment 2 of the present invention. Configuration parts that are identical in FIG. 3 and FIG. 4 are assigned the same reference codes, and duplicate descriptions are omitted here.

As shown in FIG. 7, UART interface 200 is configured by means of CPU 210, register 220, and tolerant buffer circuit 100 having output circuit 110 and control circuit 130. External system circuit 230, an external device, is connected to tolerant buffer circuit 100.

UART interface 200 incorporating tolerant buffer circuit 100 is an interface configured by means of a receiver (RX) section that receives a signal from external system circuit 230, and a transmitter (TX) section that transmits a signal from CPU 210 to external system circuit 230. FIG. 7 shows the interface of the transmitter (TX) section that transmits a signal from the CPU 210 side to external system circuit 230. Transmitted and received signals are UART signals.

Power for tolerant buffer circuit 100, CPU 210, and register 220 is supplied from power supply terminal VDD1, while external system circuit 230 operates on a different power supply.

CPU 210 output is connected to input terminal IN of tolerant buffer circuit 100, and register 220 outputs are connected to input terminals A and B of tolerant buffer circuit 100.

Tolerant buffer circuit 100 includes control circuit 130 and Output of output circuit 110, and control circuit 130 output is connected to the input of output circuit 110. Output circuit 110 output is connected to output terminal 102 of tolerant buffer circuit 100, and output terminal 102 is connected to an input/output terminal of external system circuit 230 configured with a different power supply.

The operation of a peripheral block including tolerant buffer circuit 100 configured as described above will now be explained.

As shown in FIG. 7, CPU 210 writes desired data to register 220, and the written data is converted to parallel data A and B and output from register 220 to tolerant buffer circuit 100. Signals input to input terminals A and B of tolerant buffer circuit 100 are input to control circuit 130, control output circuit 110, and set the operating mode of output terminal 102. Signal IN from CPU 210 may be output as a push-pull mode or open-drain mode signal from output terminal 102 according to the output circuit 110 operating mode, or output terminal 102 may enter high-impedance mode irrespective of the state of signal IN.

In the above operation, if register 220 sends high/low levels to input terminals A/B, output terminal 102 enters high-impedance mode, and output terminal 102 goes to a high-impedance state irrespective of the high/low level of a signal sent to input terminal IN from CPU 210.

Also, if register 220 sends a low level to both input terminals A and B, output terminal 102 enters low mode, and output terminal 102 goes to a ground state irrespective of the high/low level of a signal sent to input terminal IN from CPU 210.

Furthermore, if register 220 sends a high level to both input terminals A and B, output terminal 102 enters push-pull operation mode, and output terminal 102 performs push-pull operation, switching between high/low levels according to the high/low level of a signal sent to input terminal IN from CPU 210.

During above-described push-pull operation, it is possible for output terminal 102 to send a signal for which a dynamic range can be adequately secured to external system circuit 230 configured with a different power supply due to the configuration of output circuit 110 of tolerant buffer circuit 100.

Then, when register 220 sends low/high levels to both input terminals A/B, output terminal 102 enters open-drain operation mode, and output terminal 102 performs open-drain operation, switching between high/low levels according to the high/low level of a signal sent to input terminal IN from CPU 210.

During above-described open-drain operation, even if the potential of output terminal 102 is higher than VDD1, such as when the output section of external system circuit 230 configured with a different power supply from output terminal 102 has a configuration using a resistance between the power supply to which a higher potential than VDD1 is applied and the output terminal and an N-channel MOS transistor between the output terminal and ground, for example, there is no reverse inflow of current to power supply terminal VDD1 due to the configuration of output circuit 110 of tolerant buffer circuit 100, and it is possible to prevent a reverse current from output terminal 102.

Thus, according to Embodiment 2, by applying tolerant buffer circuit 100 shown in FIG. 3 and FIG. 4 to UART interface 200, a reverse inflow current can be prevented from flowing to VDD1 from the power supply of external system circuit 230 via output terminal 102 even during open-drain operation of output circuit 110 or if VDD1 becomes 0 V. With UART interface 200, various kinds of devices are connected to external system circuit 230 as external devices. Tolerant buffer circuit 100 provided in UART interface 200 enables a reverse inflow current to be prevented from flowing to VDD1 from output terminal 102 even if output terminal 102 potential becomes higher than the output circuit 110 power supply voltage during open-drain operation of output circuit 110, or if VDD1 of output circuit 110 becomes 0 V, making it suitable for various kinds of output interfaces including a UART interface. Also, for the same reason, tolerant buffer circuit 100 can be generally used for various kinds of output interfaces. Furthermore, the simple configuration enables this circuit to be implemented at low cost.

Embodiment 3

Embodiment 3 is an example in which a plurality of UART interfaces and/or interfaces to external system devices are provided.

Figure 8:
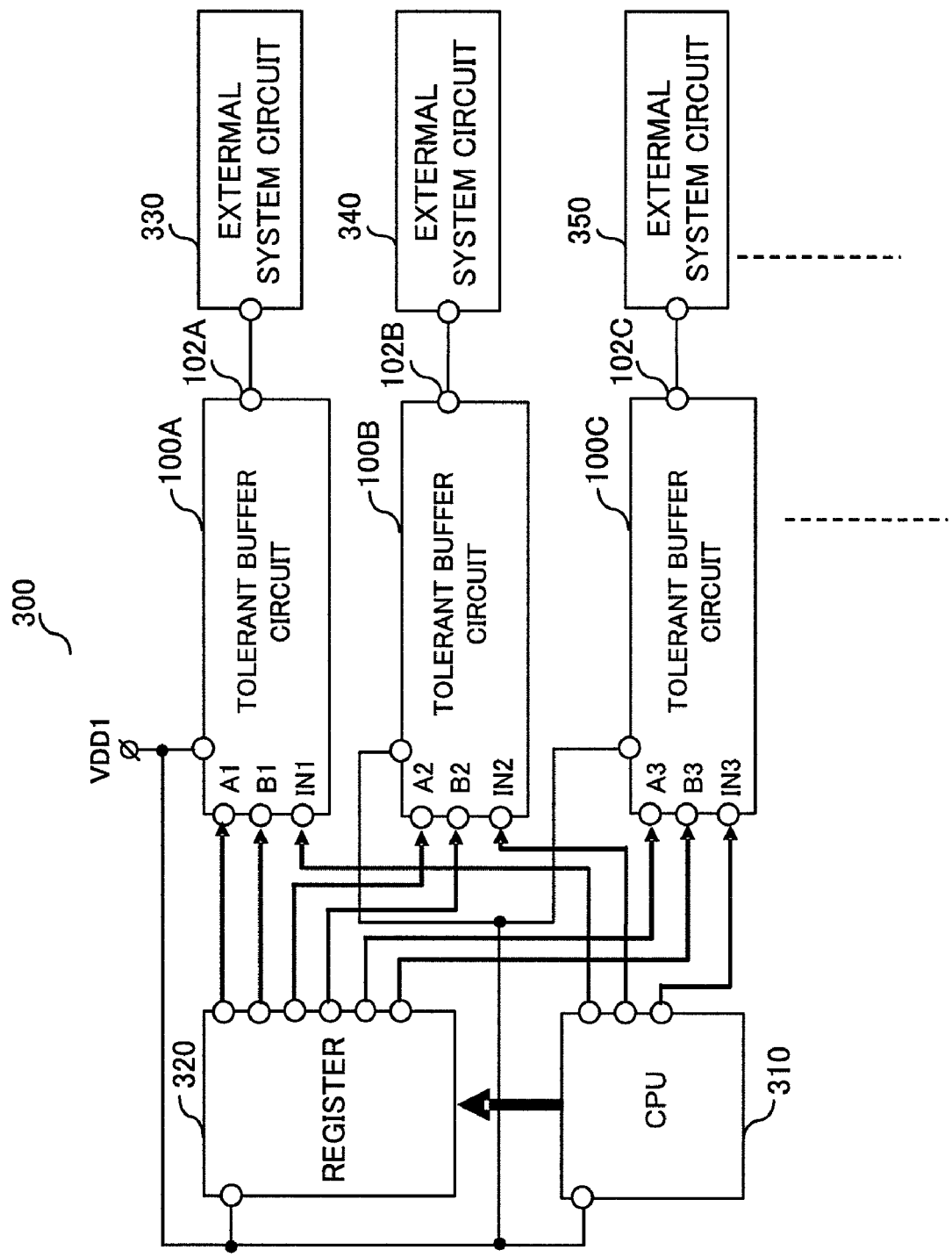
FIG. 8 is a peripheral configuration block diagram including tolerant buffer circuits according to Embodiment 3 of the present invention.

FIG. 8 is a peripheral configuration block diagram including tolerant buffer circuits according to Embodiment 3 of the present invention.

As shown in FIG. 8, output interface 300 is configured by means of CPU 310, register 320, and plurality of tolerant buffer circuits 100A, 100B, and 100C. External system circuits 330, 340, and 350 are connected to tolerant buffer circuits 100A, 100B, and 100C respectively.

Tolerant buffer circuits 100A, 100B, and 100C have the same kind of configuration as tolerant buffer circuit 100 shown in FIG. 3, FIG. 4, and FIG. 7. Tolerant buffer circuits 100A, 100B, and 100C are provided with input terminals through A3, B1 through B3, and IN1 through IN3, and output terminals 102A, 102B, and 102C, respectively.

Signals output from the CPU 310 side are input to input terminals IN1, IN2, and IN3 of tolerant buffer circuits 100A, 100B, and 100C. As described above, tolerant buffer circuits 100A, 100B, and 100C transmit signals to external system circuits 330, 340, and 350 via output terminals 102A, 102B, and 102C in accordance with a push-pull, open-drain, or suchlike operating mode. When tolerant buffer circuit 100A is UART interface 200, for example, such a signal is a UART signal.

Here, it is possible for tolerant buffer circuits 100A, 100B, and 100C to transmit various kinds of signals according to the connected external devices (external system circuits 330, 340, and 350).

Power for tolerant buffer circuits 100A, 100B, and 100C, CPU 310, and register 320 is supplied from power supply terminal VDD1, while external system circuits 330, 340, and 350 operate on a different power supply.

CPU 310 outputs are connected to input terminals IN1, IN2, and IN3 of tolerant buffer circuits 100A, 100B, and 100C, and register 220 outputs are connected to input terminals, A2, and A3, and B1, B2, and B3, of tolerant buffer circuits 100A, 100B, and 100C.

Output terminal 102A of tolerant buffer circuit 100A is connected to an input/output terminal of external system circuit 330 configured with a different power supply, and similarly, output terminals 102B and 102C of other tolerant buffer circuits 100B and 100C are connected to external system circuits 340 and 350 configured with respective power supplies.

The operation of a peripheral block including tolerant buffer circuits 100A, 100B, and 100C configured as described above will now be explained. The basic operation is similar to the operation of a peripheral block including tolerant buffer circuit 100 shown in FIG. 7, and therefore a description thereof is omitted here, and only differences in operation are described.

As shown in FIG. 8, CPU 310 writes desired data to register 320. Register 320 converts the data written by CPU 310 to plurality of parallel data, A2, and A3, and B1, B2, and B3. Register 320 outputs parallel data, A2, and A3, and B1, B2, and B3 to tolerant buffer circuits 100A, 100B, and 100C respectively.

According to the data input to input terminals and B1, tolerant buffer circuit 100A switches the mode of output circuit 110 (see FIG. 7) of tolerant buffer circuit 100A, and also sets the operating mode of output terminal 102A. Signal IN1 from CPU 310 may be output as a push-pull mode or open-drain mode signal from output terminal 102A according to the aforementioned operating mode, or output terminal 102A may enter high-impedance mode irrespective of the state of signal IN1.

In a similar way to tolerant buffer circuit 100A, tolerant buffer circuits 100B and 100C set the operating mode of output terminals 102B and 102C according to the data input to input terminals A2, A3, B2, and B3. Signals IN2 and IN3 from CPU 310 are output from output terminals 102B and 102C in accordance with the set operating mode.

Various kinds of configuration are possible for the input/output sections of external system circuits 330, 340, and 350 connected to output terminals 102A, 102B, and 102C, including input to the gate of a MOS transistor, open-drain, pull-up resistance input/output from a different power supply, and so forth.

With a tolerant buffer circuit of the present invention, the configuration is not limited to connected circuit input/output, there is no reverse inflow of current to power supply terminal VDD1, and it is possible to prevent a reverse current from an output terminal.

Also, depending on the configuration of the CPU, a plurality of interface signals may further be transmitted, but the configuration is not limited to the above, and it is possible, for example, to configure an interface that performs parallel connection at one time of a tolerant buffer circuit of the present invention for each interface signal of the CPU.

Furthermore, with regard to circuitry having a different power supply that is connected to an output terminal of a tolerant buffer circuit, even with a configuration in which a plurality of circuits are connected to one output terminal, reverse inflow of current to power supply terminal VDD1 can be prevented in each operating mode whatever the potential of VDD1.

Thus, according to Embodiment 3, output interface 300 is provided with plurality of tolerant buffer circuits 100A, 100B, and 100C, connected to external system circuits 330, 340, and 350 respectively. External system circuits 330, 340, and 350 are UART interfaces and/or external system device output interfaces. Also, tolerant buffer circuit 100 of Embodiment 1 is applied to tolerant buffer circuits 100A, 100B, and 100C. Therefore, in the same way as in Embodiments 1 and 2, a reverse inflow current can be prevented from flowing to power supply terminal VDD1 from an external system circuit 230 power supply via output terminal 102 even during output open-drain operation or if VDD1 becomes 0 V.

In particular, in Embodiment 3 the operation of tolerant buffer circuits 100A, 100B, and 100C can be set arbitrarily—for example, to a high-impedance state, low state, push-pull operation, open-drain operation, and so forth—in line with the characteristics and required performance of external system circuits 330, 340, and 350 connected to output interface 300. Embodiment 3 has an excellent effect of allowing general use as an interface to any kind of external device.

The above description presents examples of preferred embodiments of the present invention, but the scope of the present invention is not limited to these. For example, in the above embodiments examples have been described in which MOS transistors are used, but any kind of MOS transistors may be used. For example, MIS (Metal Insulator Semiconductor) transistors may also be used, and these MIS transistors may be MIS transistors formed on a silicon substrate with an SOI (Silicon On Insulator) structure. Furthermore, bipolar transistors, Bi-CMOS transistors, or a combination thereof may be used. However, it goes without saying that MOS transistors are advantageous from the standpoint of power consumption.

For convenience of description, the term "tolerant buffer circuit" has been used in the above embodiments, but terms such as "buffer circuit," "output circuit," and so forth may of course also be used.

Details of circuit sections configuring an above-described tolerant buffer circuit—for example, the number of inverter gate stages, the types of logic elements, and so forth—are not limited to those in the above embodiments. It goes without saying that various kinds of compensating transistors may be added to the tolerant buffer circuit.

Thus, according to the present invention, a tolerant buffer circuit can be implemented in which reverse inflow of current to a power supply voltage from an output terminal does not occur even if an output terminal is at a higher potential than an output circuit power supply voltage during open-drain operation of an output circuit, or if an output circuit power supply voltage becomes 0 V. Moreover, the present invention can be realized by means of an extremely simple circuit configuration, enabling easy implementation with a small number of component parts.

Therefore, it is possible for a tolerant buffer circuit according to the present invention to be applied as a tolerant buffer circuit to the output circuit section of semiconductor integrated circuits in general.

The invention claimed is:

1. A tolerant buffer circuit, comprising:
a first P-channel MOS transistor and a second P-channel MOS transistor that are connected in series and that share a source between a power supply terminal and an output terminal;
a first N-channel MOS transistor that is connected between the output terminal and a ground terminal; and
a control circuit that outputs a first control signal, a second control signal and a third control signal to the first P-channel MOS transistor, the second P-channel MOS transistor and the first N-channel MOS transistor, respectively, and controls an on/off state of the first P-channel MOS transistor, the second P-channel MOS transistor, and the first N-channel MOS transistor, wherein:
back gates of the first P-channel MOS transistor and the second P-channel MOS transistor are connected to the source, so that parasitic diodes produced in the first P-channel MOS transistor and the second P-channel MOS transistor are connected in a reverse direction with respect to a low voltage power supply; and
the control circuit:
(a) implements a push-pull operation in which the low voltage power supply and ground potential are output to the output terminal by:
(i) driving the first control signal high and driving the second and third control signals low and high, or high and low, respectively, or
(ii) driving the first, second and third control signals low, low, and high, or high, high and low, respectively; and (b) implements an open-drain operation for the output terminal by driving the first and second control signals low and driving the third control signal high or low.

2. The tolerant buffer circuit according to claim 1, wherein gates of the first P-channel MOS transistor and the second P-channel MOS transistor are connected to ground potential, or a potential of the source, based on the first control signal and the second control signal; and
a gate of the first N-channel MOS transistor is connected to ground potential or power supply potential based on the third control signal.

3. The tolerant buffer circuit according to claim 1, further comprising:
a first inverter that is configured to receive a potential of sources of the first P-channel MOS transistor and the second P-channel MOS transistor as a power supply, to which the first control signal is input, and that is output-connected to a gate of the first P-channel MOS transistor; and
a second inverter that is configured to receive a potential of sources of the first P-channel MOS transistor and the second P-channel MOS transistor as a power supply, to which the second control signal is input, and that is output-connected to a gate of the second P-channel MOS transistor.

4. The tolerant buffer circuit according to claim 1, wherein the control circuit operates on a power supply of the power supply terminal.

5. The tolerant buffer circuit according to claim 3, wherein:
the first inverter has:
a third P-channel MOS transistor, a source of the third P-channel MOS transistor being connected to the source shared by the first P-channel MOS transistor and the second P-channel MOS transistor; and
a second N-channel MOS transistor sharing a drain and gate with the third P-channel MOS transistor, a source of the second N-channel MOS transistor being grounded, and
the second inverter has:
a fourth P-channel MOS transistor, a source of the fourth P-channel MOS transistor being connected to the source shared by the first P-channel MOS transistor and the second P-channel MOS transistor; and
a third N-channel MOS transistor sharing a drain and gate with the fourth P-channel MOS transistor, a source of the third N-channel MOS transistor being grounded.

6. An interface that outputs CPU and register output signals to an external device via a tolerant buffer circuit,
wherein the tolerant buffer circuit is the tolerant buffer circuit according to claim 1.

* * * * *